Dec. 29, 1953

G. S. WHIDDEN 2,664,501

FREQUENCY CONVERSION SYSTEM

Filed Aug. 10, 1949

INVENTOR.
Glen S. Whidden

BY Ostrolenk & Faber

ATTORNEYS

Patented Dec. 29, 1953

2,664,501

UNITED STATES PATENT OFFICE 2,664,501

FREQUENCY CONVERSION SYSTEM

Glen S. Whidden, Charlotte, Mich., assignor to The Wilcox-Gay Corporation, Charlotte, Mich., a corporation of Michigan Application August 10, 1949, Serial No. 109,609

3 Claims. (Cl. 250—20)

My invention relates to radio frequency circuits and more particularly to frequency conversion systems operated at frequencies of the general order of fifty to one hundred megacycles and above.

While the normal radio broadcast frequencies of the order of one-half to one and a half megacycles, inductance or capacitance circuit elements are obtained in essentially pure form, when operations at higher frequencies of the order of fifty to one hundred megacycles are desired, it is substantially impossible to attain pure circuit elements.

Condensers which have substantially pure capacitance at the lower frequencies referred to above tend to show significant series inductance at the higher frequencies. Correspondingly, inductances which are substantially pure inductances at the lower frequencies exhibit significant distributive capacities at higher frequencies. Even resistors may have sufficient shunt capacity at these higher frequencies to interfere with their normal resistance function.

Moreover lead connections between the various circuit elements which have negligible self-impedance at lower frequencies prevents this at higher frequencies due to the bulk of the elements. Thus, for example, a connecting lead of essentially high impedance at the lower frequencies exhibits series inductance and shunt capacitance to ground at the higher frequencies.

For these reasons, circuits which function satisfactorily at lower frequencies are unsatisfactory at the higher frequencies. I have discovered that the circuits can be re-arranged to lend themselves to short connecting leads in a compact arrangement of components which substantially removes the difficulties encountered in the longer leads at these higher frequencies.

Another difficulty in the operation of frequency converters at higher frequencies arises from the change in frequency of the local heterodyning oscillator during the warm-up period before the tubes and associated components reach temperature equilibrium. During this warm-up period, the impedance presented by the tube becomes a significant portion of the frequency determining tank circuit at higher frequencies. This results in a frequency drift.

I have discovered that this frequency drift can be largely cancelled out by employing a negative temperature coefficient condenser as part of the tank circuit. In a preferred embodiment, the circuit is arranged so that this negative temperature co-efficient condenser is connected directly to the heater or cathode terminal. Placing the condenser as close to the tube as possible, good thermal conduction between the condenser and heater elements is established.

Since the larger portion of the frequency drift occurs during the first few minutes of warm-up period, but equilibrium is not established for about fifteen or twenty minutes, this thermal coupling becomes important. In order to retain a substantial part of the original tuning range, the compensating condenser should be as small as possible.

Accordingly, an object of my invention is to provide a novel tank oscillator circuit having negative coefficient condensers.

A further object of my invention is to provide compensating condensers affected by the heating elements of the tube.

Still a further object of my invention is to provide a tank oscillator circuit, the oscillations of which are controlled by the heating elements from the tube.

Still a further object of my invention is to provide negative temperature coefficient condensers mounted on the tube sockets.

Where separate sets of tube elements are employed for the oscillator and mixer of a convertor system, circuit means must be provided for coupling the oscillator to the mixer. For maximum conversion efficiency, the amplitude of the oscillator signal coupled to the mixer must be of a predetermined value.

In the lower frequency technique heretofore employed, a tap was made on the oscillator inductance but this, because of the physical dimensions involved, presents unfavorable impedance in the higher frequency ranges. Moreover, it tends to provide undesired mutual coupling between the lead and one of the inductances.

Where such coupling exists, the positioning of the lead becomes critical.

I have discovered that by the use of a capacitative voltage divider in the oscillator circuit, I can achieve optimum value of oscillator signal for coupling to the mixer.

Such use of a capacitative voltage divider eliminates any possible mutual inductive coupling.

Moreover, such voltage divider condensers may be of the type having a negative temperature coefficient so as to provide the desired compensation of oscillator frequency drift during the warm-up period.

At least three of the four condenser terminals of the series connected voltage divider condensers are also connected directly to the heater tube elements resulting in effective and quick thermal conduction. To further promote such thermal conduction, the condensers may be mounted directly on the tube socket.

Inasmuch as the capacities involved in obtaining the desired amount of oscillator coupling are no greater than those required for frequency compensation, a maximum tuning range is realized.

Accordingly, a further object of my invention is to provide a coupling means between a tank circuit and mixer comprising a series condenser voltage divider.

Still another object of my invention is to provide a frequency conversion system which is effective when operated at a frequency of fifty to a hundred megacycles and above, and which uses combined frequency compensation and oscillator coupling means.

These and other objects of my invention will be apparent in the following descriptions in connection with the drawing in which.

Figure 1:
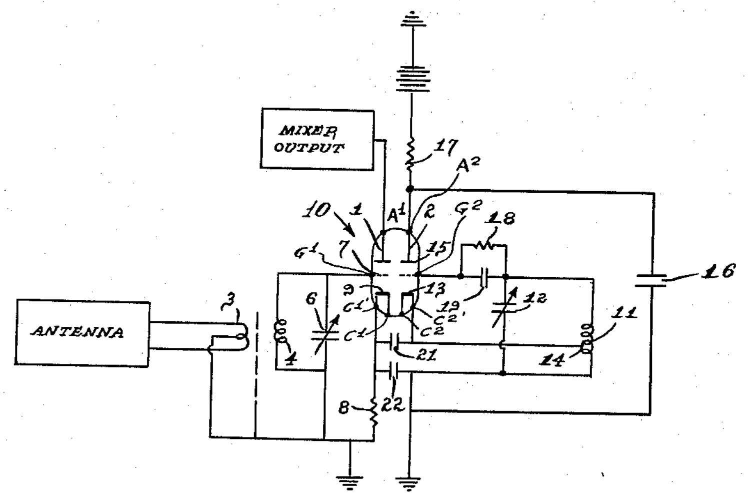
Figure 1 is a circuit diagram of my invention.

Referring to Figure 1, the tube 10 comprising a first set of elements 1 is connected to a mixer output and a second set of elements 2 is connected to a local heterodyne oscillator. The input signal as from an antenna is applied to the grid 7 of elements 1 through a suitable coupling means such as primary 3 of a radio frequency transformer coupled to the secondary 4. Connected across the secondary 4 is a variable condenser 6 by which the tunable circuit elements 6 and 4 are tuned to the desired incoming signal frequency. Grid bias for the tube elements 1 is provided by means of a cathode resistor 8 connected between the cathode and ground.

Referring now to the local heterodyne oscillator, the oscillator inductance 11 is tuned by means of the variable condenser 12 connected across the terminal of the inductance 11. Cathode 13 is connected to inductance 11 at the point 14 which is chosen to provide the most stable oscillation for the entire tuning range of the oscillator circuit. Plate 15 is by-passed to ground by means of condenser 16 and receives its anode potential from the plate supply through decoupling resistor 17. The usual grid leak resistor 18 and condenser 19 are connected to the grid of tube 2 in the usual manner.

The oscillator circuit, in addition to the inductance 11 and variable condenser 12 includes condensers 21 and 22 connected between the terminal 14 and the grounded side of inductance 11. These condensers 21 and 22 have a negative temperature coefficient and the total series capacitance thereof is chosen so as to provide the desired compensation for frequency shift.

These condensers are connected so as to be directly affected by the heating elements of the two tubes in order to provide maximum compensation for frequency drift during the warm-up period. Indeed, as illustrated in the drawing, both terminals of condenser 21 are directly connected to the heater elements or cathodes of tubes 1 and 2 and at least one of the terminals of condenser 22 is connected directly to the heating element of tube 1.

As illustrated, condensers 21 and 22 provide a voltage divider which ratio is so chosen as to provide the optimum amplitude signal for coupling the oscillator circuit to the cathode 9 of tube 1 from a point intermediate condensers 21 and 22 as shown.

It will be obvious that the ratio of these two condensers can be made any desired value while maintaining any desired value of total series capacitance so that optimum conditions of coupling and temperature compensation can be realized simultaneously.

It should also be noted that optimum oscillator coupling can be obtained independently of the position of tap 14, thus permitting the oscillator feed back to be adjusted independently of all other considerations.

Figure 2:
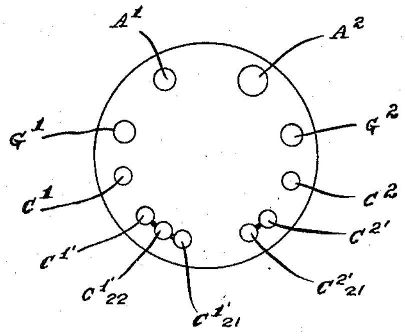
Figure 2 is a schematic of one form of base for elements of the mechanism.

In the normal circuit constructions, the two sets of tube elements will usually be contained in a single envelope, as is here illustrated. In this case, condensers 21 and 22 may be mounted on the tube socket terminals where they will be in the closest possible thermal contact with the heated tube elements, as schematically illustrated in Figure 2 in which $A^1$ and $A^2$ represent the sockets for the anode terminals of elements 1 and 2 respectively, $G^2$ and $G^1$ the sockets for the grid terminals, $C^2$ and $C^1$ the sockets for one of the cathode terminals. Socket $C^{1\prime}$ for the opposite terminal of cathode 9 is connected to sockets $C^{1\prime}21$ and $C^{1\prime}22$ which are for the one terminal of each of the condensers 21 and 22 and $C^{2\prime}21$, the socket for the opposite terminal of condenser 21 is connected to the socket $C^{2\prime}$ for the other terminal of cathode 13. A socket for the final terminal of condenser 22 may also be provided on this base.

Where desired, it is also possible to connect the heater directly to the cathode 13, thus further improving the correlation between the temperature of the compensating condensers and the tube elements.

While I have shown a preferred embodiment of my invention, I do not wish to be limited thereby, except as set forth in the appended claims.

I claim:

1. In an ultra-high frequency conversion circuit, a tunable oscillator tank circuit comprising a first inductance and a first variable capacitance connected across said first inductance for tuning said oscillator circuit, a first electron tube having a cathode, grid and anode, circuit connections from said cathode to an intermediate connection point on said inductance such that maximum stable oscillations for the entire tuning range of said oscillator circuit is secured, circuit connections from one terminal of said oscillator circuit to the grid of said tube the other terminal of said oscillator circuit being grounded, a voltage divider connected in said oscillator tank circuit between said intermediate connection point on said oscillator inductance and the other terminal of said oscillator circuit, said voltage divider comprising a plurality of series connected condensers between the cathode of said first electron tube to said oscillator circuit and said intermediate connection point of said oscillator inductance having a negative temperature coefficient and mounted in close proximity to said tube to be affected by the heat of the cathode of said tube, the total series capacity of said series connected condensers having a value function of the temperature fluctuations of the electrodes of said oscillator circuit to compensate for frequency drift due to such temperature fluctuations, a mixer circuit including a tunable circuit comprising a second inductance and a second variable condenser connected across said second inductance for tuning said tunable circuit to a desired incoming frequency, a second electron tube having a cathode grid and anode, said tunable circuit being connected to the grid of said second tube, and circuit connections from a connection between the two of said series connected condensers to the cathode of said second electron tube.

2. In an ultra-high frequency conversion circuit, a tunable oscillator tank circuit comprising a first inductance and a first variable capacitance connected across said first inductance for tuning said oscillator circuit, a first electron tube having a cathode, grid and anode, circuit connections from said cathode to an intermediate connection point on said inductance such that maximum stable oscillations for the entire tuning range of said oscillator circuit is secured, circuit connections from one terminal of said oscillator circuit to the grid of said tube, a voltage divider connected in said oscillator tank circuit between said intermediate connection point on said oscillator inductance and the other terminal of said oscillator circuit, said voltage divider comprising a plurality of series connected condensers between the cathode of said first electron tube to said oscillator circuit and said intermediate connection point of said oscillator inductance having a negative temperature coefficient, the total series capacity of said series connected condensers having a value function of the temperature fluctuations of the electrodes of said oscillator circuit to compensate for frequency drift due to such temperature fluctuations, a mixer circuit including a tunable circuit comprising a second inductance and a second variable condenser connected across said second inductance for tuning said tunable circuit to a desired incoming frequency, a second electron tube having a cathode, grid and anode, said tunable circuit being connected to the grid of said second tube, and circuit connections from a connection between the two of said series connected condensers to the cathode of said second electron tube for coupling said oscillator circuit to said tunable receiver circuit to heterodyne the incoming signal, the intermediate connection to said series connected condenser being selected to provide optimum oscillation coupling, said series condensers being mounted on the tube socket terminals of said tubes to provide close thermal contact from the cathodes of said tubes to said condensers, the opposite electrodes of at least one of said series connected condensers being connected directly to the cathodes of said first and second tube and the electrode of at least another of said series connected condensers being connected to at least one of the cathodes of said tubes.

3. In an ultra-high frequency conversion circuit, a tunable oscillator tank circuit comprising a first inductance and a first variable capacitance connected across said first inductance for tuning said oscillator circuit, a first electron tube having a cathode, grid and anode, circuit connections from said cathode to an intermediate connection point on said inductance such that maximum stable oscillations for the entire tuning range of said oscillator circuit is secured, circuit connections from one terminal of said oscillator circuit to the grid of said tube, a voltage divider connected in said oscillator tank circuit between said intermediate connection to said oscillator inductance and ground, said voltage divider comprising a plurality of series connected condensers, the total series capacity of said series connected condensers between the cathode of said first electron tube to said oscillator circuit and said intermediate connection point of said oscillator inductance having a value function of the temperature fluctuations of the electrodes of said oscillator circuit to compensate for frequency drift due to such temperature fluctuations, a tunable circuit comprising a second inductance and a second variable condenser connected across said second inductance for tuning said tunable circuit to a desired incoming frequency, a second electron tube having a cathode grid and anode, said tunable circuit being connected to the grid of said second tube, and circuit connections from a connection between the two of said series connected condensers to the cathode of said second electron tube for coupling said oscillator circuit to said tunable receiver circuit to heterodyne the incoming signal, the intermediate connection to said series connected condenser being selected to provide optimum oscillation coupling.

GLEN S. WHIDDEN.

References Cited in the file of this patent

UNITED STATES PATENTS

| Number | Name | Date |
|---|---|---|
| 2,051,177 | Rath | Aug. 18, 1936 |
| 2,144,009 | Barber | Jan. 17, 1939 |
| 2,235,816 | Freeman | Mar. 25, 1941 |
| 2,266,670 | Winfield | Dec. 16, 1941 |
| 2,281,461 | Smith | Apr. 28, 1942 |
| 2,284,372 | Crosby | May 26, 1942 |
| 2,309,031 | Worchester, Jr. | Jan. 19, 1943 |
| 2,441,452 | Strutt et al. | May 11, 1948 |
| 2,453,078 | Posthumus | Nov. 2, 1948 |
| 2,470,425 | Bell | May 17, 1949 |
| 2,472,021 | Mitchell | May 31, 1949 |
| 2,503,780 | Van Der Ziel | Apr. 11, 1950 |
| 2,508,048 | Sziklai | May 16, 1950 |

FOREIGN PATENTS

| Number | Country | Date |
|---|---|---|
| 516,152 | Great Britain | Dec. 22, 1939 |

OTHER REFERENCES

Bushby, "Thermal Frequency Drift Compensation," Proc. IRE, vol. 30, No. 12, December 1942, pages 546 to 553.